(12) United States Patent
Schroderus et al.

(10) Patent No.: US 6,195,274 B1
(45) Date of Patent: Feb. 27, 2001

(54) METHOD FOR DEFINING INSTANTANEOUS VALUE OF CURRENT OF PULSE-CONTROLLED INDUCTIVE LOAD

(75) Inventors: Petri Schroderus, Espoo; Samuli Heikkilä, Helsinki, both of (FI)

(73) Assignee: ABB Industry Oy (FI)

( * ) Notice: Subject to any disclaimer, the term of this patent is extended or adjusted under 35 U.S.C. 154(b) by 0 days.

(21) Appl. No.: 09/555,334

(22) PCT Filed: Dec. 18, 1998

(86) PCT No.: PCT/FI98/00997

§ 371 Date: May 30, 2000

§ 102(e) Date: May 30, 2000

(87) PCT Pub. No.: WO99/32891

PCT Pub. Date: Jan. 1, 1999

(30) Foreign Application Priority Data

Dec. 22, 1997 (FI) .......................................... 974599

(51) Int. Cl.$^7$ ...................................................... H02J 1/02
(52) U.S. Cl. ................................. 363/39; 363/40; 363/44
(58) Field of Search ................................. 363/39, 40, 41, 363/42, 44, 45, 46, 47

(56) References Cited

U.S. PATENT DOCUMENTS

| 4,350,943 | 9/1982 | Pritchard . |
|---|---|---|
| 4,575,668 | 3/1986 | Baker . |
| 5,079,498 | 1/1992 | Cleasby et al. . |
| 5,381,328 | * 1/1995 | Umezawa et al. ................ 362/41 |
| 5,390,070 | 2/1995 | Niedermeier . |
| 5,391,976 | * 2/1995 | Farrington et al. ............... 363/45 |
| 5,446,647 | 8/1995 | Ikeda et al. . |
| 5,637,974 | 6/1997 | Pummer et al. . |

* cited by examiner

Primary Examiner—Peter S. Wong
Assistant Examiner—Gary L. Laxton
(74) Attorney, Agent, or Firm—Dykema Gossett, PLLC

(57) ABSTRACT

A method of defining an instantaneous value of a current (i2e) of a pulse-controlled inductive load when the impedance of the load is known, the method comprising the steps of: measuring the output voltage (u1) of a pulsed voltage source, and measuring the output current (i1) of the pulsed voltage source. The method is characterized by further comprising the steps of: low-pass filtering the measured output current (i1) of the pulsed voltage source to produce a fundamental wave current (i1lp), defining a load current estimate (i2est) by computation on the basis of the measured output voltage (u1) of the pulsed voltage source and the impedance of the load, high-pass filtering the load current estimate (i2est), and defining the instantaneous value of the load current (i2e) by adding the high-pass-filtered load current estimate (i2hp) to the fundamental wave current (i1lp).

6 Claims, 2 Drawing Sheets

METHOD FOR DEFINING INSTANTANEOUS VALUE OF CURRENT OF PULSE-CONTROLLED INDUCTIVE LOAD

BACKGROUND OF INVENTION

The invention relates to a method according to the preambles of independent claims 1 and 5 for defining an instantaneous value of a current of a pulse-controlled inductive load when the impedance of the load is known, the method comprising the steps of measuring the output voltage of a pulsed voltage source, and measuring the output current of the pulsed voltage source.

The current or magnetic flux of the inductive load is normally controlled by changing the voltage affecting over the load, the voltage typically consisting of single or multi-level voltage pulses generated by semiconductor switches. The simplest solution is that the switches operate at a fixed switching frequency, whereby the pulse width of the voltage pulses determines the average voltage level in the load. An example for such a pulsed voltage source is a pulse-width-modulated (PWM) voltage source. The current of the load is here quite well controlled dynamically, if the switching frequency is sufficiently high.

On account of the switching losses of the semiconductor switches, the switching frequency is kept as low as possible, particularly in connection with high-power apparatus, such as frequency converters that control squirrel-cage induction motors. Accurate dynamic control of the current of the load can here be achieved only if the switching of the switches is based directly on the instantaneous values of the current of the load. The pulsed voltage sources based on the use of instantaneous values of the current of the load include, for example, voltage sources that are based on the Direct Torque Control (DTC) and tolerance band control of the current. The methods work well when the load is close to the voltage source that generates voltage pulses, and when there are no capacitive components between the load and the pulsed voltage source, whereby the current of the load can be measured in undisturbed conditions.

In practice, however, the load is often situated at a relatively long distance from the voltage source supplying it. The instantaneous current of the pulsed voltage source then differs from the instantaneous current of the load on account of the currents passing through the stray capacitances in the supply cable. The reason for this is that the transfer impedance of the cable is usually much lower than the impedance of the inductive load. Because the impedances are not equal, each voltage pulse supplied generates voltage oscillation at that end of the supply cable which is close to the load, and current oscillation at that end of the supply cable which is close to the voltage source.

The modulation basis used is usually the current measured at the end of the voltage source; above a certain length of cable the measurements are so inaccurate due to the current oscillation that the instantaneous value of the load current can no longer be controlled. When long cables are used, either the dynamics of the control has to be compromised or the current of the load has to be measured separately at the load, whereby expensive separate cabling has to be installed to enable the transfer of the measuring signal. Apart from the long cables, capacitive components between the load and the voltage source also inhibit the above kind of modulation that is based on the current measured at the end of the voltage source. Such a capacitive component can be, for example, an LC low pass filter.

BRIEF DESCRIPTION OF INVENTION

The object of the invention is to provide a method in which the above drawbacks are avoided and to enable more reliable defining of the instantaneous value of the current of the pulse-controlled inductive load. The object is achieved with a method of the invention, which is characterized by comprising the steps of low-pass filtering the measured output current of the pulsed voltage source to produce a fundamental wave current, defining a load current estimate by computation on the basis of the measured output voltage of the pulsed voltage source and the impedance of the load, high-pass filtering the load current estimate, and defining the instantaneous value of the load current by adding the high-pass-filtered load current estimate to the fundamental wave current.

The preferred embodiments of the invention are claimed in the dependent claims.

The method of the invention is based on estimating the load current on the basis of the measured voltage of the voltage source and the estimated impedance of the load. The estimated load current is obtained by combining the fundamental wave component of the measured current and that component in the estimated current which changes when the semiconductor switches are switched.

The advantage of the claimed method is that a highly reliable estimate of the load current is obtained by a simple method. Although the cables are long, the load current can be estimated accurately by the method, whereby the dynamic control of the pulsed voltage source can be maintained at a high level under all conditions. The DTC or any current modulation whatsoever can then also be made to work in connection with long cables.

High cabling costs, which would result if the measurement were performed at that end of the supply cable which is close to the load, are avoided by the method of the invention. Further, since the method enables reliable estimation of the current, capacitive components, such as LC low-pass filters or the like, can also be connected to the supply cable where necessary.

The method allows the current of the output of the pulsed voltage source to be measured using a more cost-effective current detector than in the prior art. The highest-frequency components are filtered from the measured current in the method, whereby the bandwidth requirement of the current measurement is notably lower than in the prior art. For the same reason, an AD converter used to modify the current data can be much more cost-effective than in the prior art solutions, in which all the frequencies of the current have been measured as accurately as possible.

The problems caused by the long cables, for example, have made it necessary to restrict the switching frequency of the DTC. On account of the method of the present invention, the length of the minimum pulse of the pulsed voltage source need not be restricted, but due to the accurate current data the switching frequency can be raised arbitrarily high if so desired. The raising of the switching frequency makes it possible to further improve the dynamic accuracy of the control.

The invention further relates to a method which is characterized by comprising the steps of adding a correction term to the output voltage of the pulsed voltage source to produce an estimation voltage;

defining a load current estimate by computation on the basis of the estimation voltage and the impedance of the load, whereby the load current estimate provides the instantaneous value of the load current;

low-pass filtering the load current estimate;

low-pass filtering the measured output current of the pulsed voltage source to produce a fundamental wave current;

comparing the fundamental wave current with the low-pass-filtered load current estimate to produce an error parameter proportional to the difference of the currents; and multiplying the error parameter by a coefficient to produce the correction term.

The method of the invention is based on comparing the low-pass-filtered components of the load current estimate and the output current of the pulsed voltage source with each other, and on the basis of the comparison, adding a correction term proportional to the difference of the currents to the voltage used to compute the load current estimate. In the method, the load current estimate provides the instantaneous value of the load current.

BRIEF DESCRIPTION OF FIGURES

The invention will be described in greater detail below in connection with preferred embodiments, in which.

DETAILED DESCRIPTION OF INVENTION

Figure 1:
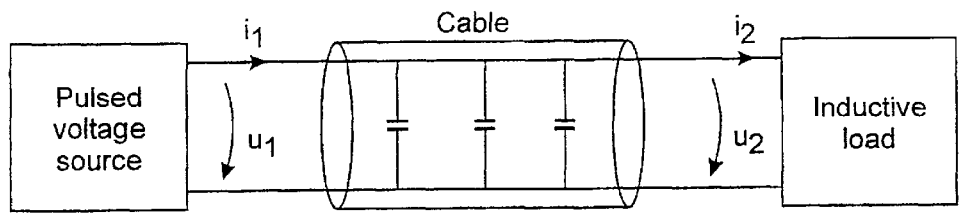
FIG. 1 is a general view illustrating supply of voltage pulses to an inductive load via a cable.
Figure 2:
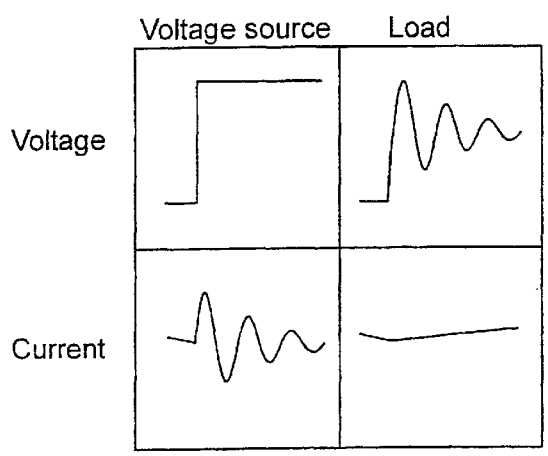
FIG. 2 illustrates the general shapes of voltage and current curves in connection with long supply cables and a pulsed voltage source.

When an inductive load is supplied via a supply cable using a pulsed voltage source as shown in FIG. 1, the output voltage u1 of the pulsed voltage source produces a voltage wave flowing along the cable. The wave is seen as voltage u2 at that end of the cable which is close to the load. The general curves of voltages u1 and u2 are shown in FIG. 2. FIG. 2 also shows the general curves of current i1 of the voltage source and of load current i2.

As shown in FIG. 2, the currents of the voltage source and the load may differ considerably at a given instant. During the switching, part of the current flows via the cable or via other partly capacitive components, which appears as oscillation of the type shown in FIG. 2 in the current measured in the voltage source. Because of the oscillation of the current, any estimates on the instantaneous value of the load current formed on the basis of the output current of the voltage source may be erroneous, and it is then difficult to set the load current to a certain value in a dynamic situation.

In the method of the present invention, the load current i2 can be defined accurately using the measured data on the output current i1 and output voltage u1 of the voltage source and the data on the impedance of the load and on the state of the load (e.g. magnitude of magnetic flux, or speed of rotation of electric machine). The impedance of the load can be either defined once, for example when the supply of current to the load is started, or alternatively updated during the use.

The method of the present invention enables accurate control of the load current, since accurate data is obtained on the actual value of the current, and the timing of the switching of the switches in the pulsed voltage source can be optimized on the basis of the data. In accordance with the method of the invention illustrated in FIG. 3, the output current i1 of the pulsed voltage source is low-pass filtered with a low-pass filter S1, whereby a fundamental wave current i1lp is obtained. The function of the low-pass filter S1 is to eliminate from the current signal any high-frequency components caused by cable oscillation. Also, the fastest changes may be filtered from the switching-frequency components of the current, caused by the changes of state of the switching components, depending on the filtering time constant τ selected. The remaining low-pass-filtered component of the measured current, i.e. the fundamental wave current i1lp, thus contains almost only the fundamental wave component of the load current, the frequency of which corresponds to a desired fundamental frequency.

The accurate values of the quickly changing high-frequency current components are not significant, since the current measured will be low-pass filtered. The bandwidth of the current measurement need not be high, either, whereby the measurement can be performed using cost-effective components.

In the method, the load current is estimated in an estimation block 1 by computation, utilizing the measured output voltage and the previously known impedance of the load. Depending on the load, the computation block can also be more complicated: it can be based, for example, on the solution algorithms of the differential equations of the stator and rotor in an induction machine. In the estimation, it is assumed that the voltage transfers to the load undistorted, whereby voltage u2 of the load corresponds to output voltage u1 of the voltage source in magnitude.

When the load is purely inductive, a load current estimate i2est at a time instant t is obtained, for example, from the equation $$i_{2est}(t) = i_{2est}(t_0) + \frac{1}{L}\int_{t=t0}^{t} u_1(t)dt$$

where L stands for the inductance of the load and u2 for the voltage of the load, the current of the load being known at time instant t0. In accordance with the formula, the output voltage u1 is integrated, whereby any voltage oscillation according to FIG. 2 would be compensated for by itself with an increase in the integration time, so when the voltage u2 of the load is replaced with the voltage u1 of the voltage source, the load current estimate i2est will not be erroneous.

Because of the integral term, the load current estimate i2est computed on the basis of the known inductance and source voltage will no longer be accurate as the time passes, and so the absolute value of the load current estimate may differ considerably from the actual load current. Any quick changes in the load current estimate, however, are an accurate reflection of the changes in the load current, whereby the load current estimate can be high-pass filtered to yield a current component that describes the switching frequency components of the load current. The absolute value of the load current estimate is thus insignificant, since only the high-pass-filtered component i2hp of the estimate is used in the embodiment.

Figure 3:
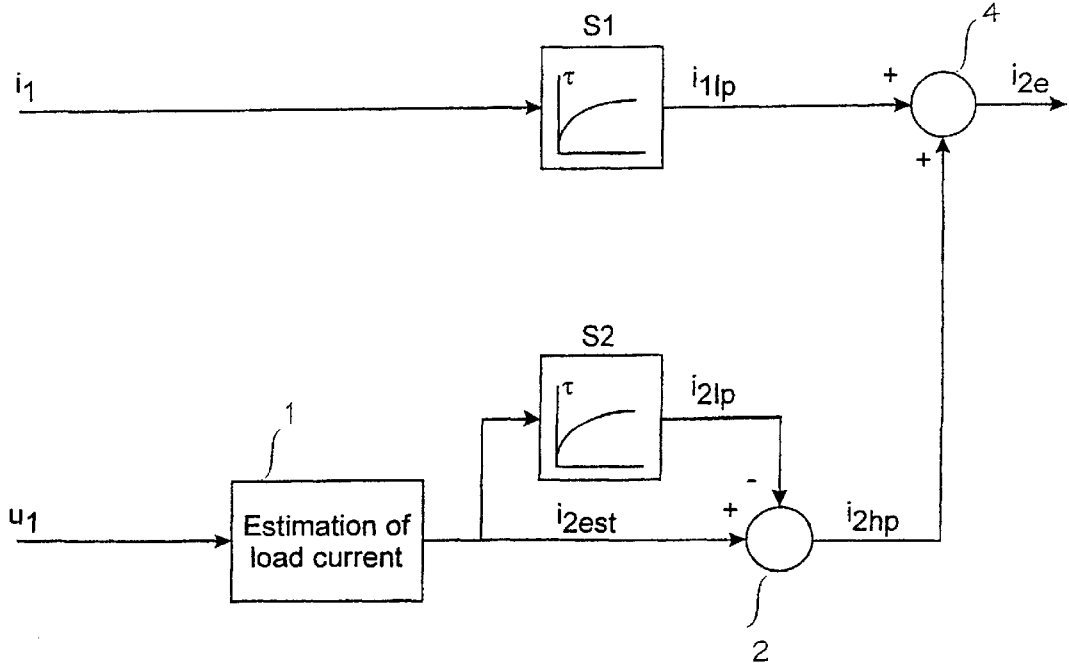
FIG. 3 is a block diagram illustrating a method of the invention.

According to an embodiment, the high-pass filtering of the load current estimate i2est is carried out by subtracting the low-pass-filtered component i2lp of the load current estimate i2est from the load current estimate i2est in a summing means 2 to obtain the high-pass-filtered component i2hp of the load current estimate. The time constant τ of the low-pass filter S2 used is substantially the same as in the low-pass filter S1. As shown in FIG. 3, the output of the estimation block 1, in which voltage u1 is inputted, is connected to the input of the low-pass filter S2 and to the summing means 2. To the other input of the summing means 2 is connected the output of the low-pass filter S2. The summing means 2 produces the difference of the signals, which is the high-pass-filtered component i2hp of the load current estimate.

The outputs of the summing means 2 and the low-pass filter S1 are connected to the inputs of a summing means 4, which yields the magnitude i2e of the load current by summing the high-pass-filtered component i2hp of the load current estimate and the low-pass-filtered component of the measured output current, i.e. the fundamental wave current i1lp. In the summing process, the fundamental frequency component of the measured current is combined with the switching frequency component of the estimated current.

When the fundamental wave of the current varies sinusoidally in connection with the low-pass filtering of the measured current, phase and amplitude errors occur in the fundamental wave current i1lp. The errors, however, are compensated for by the load current i2e when the fundamental wave current i1lp and the high-pass filtered component i2hp of the load current estimate are summed, for the filtering time constants of the filters S1 and S2 are equal.

Figure 4:
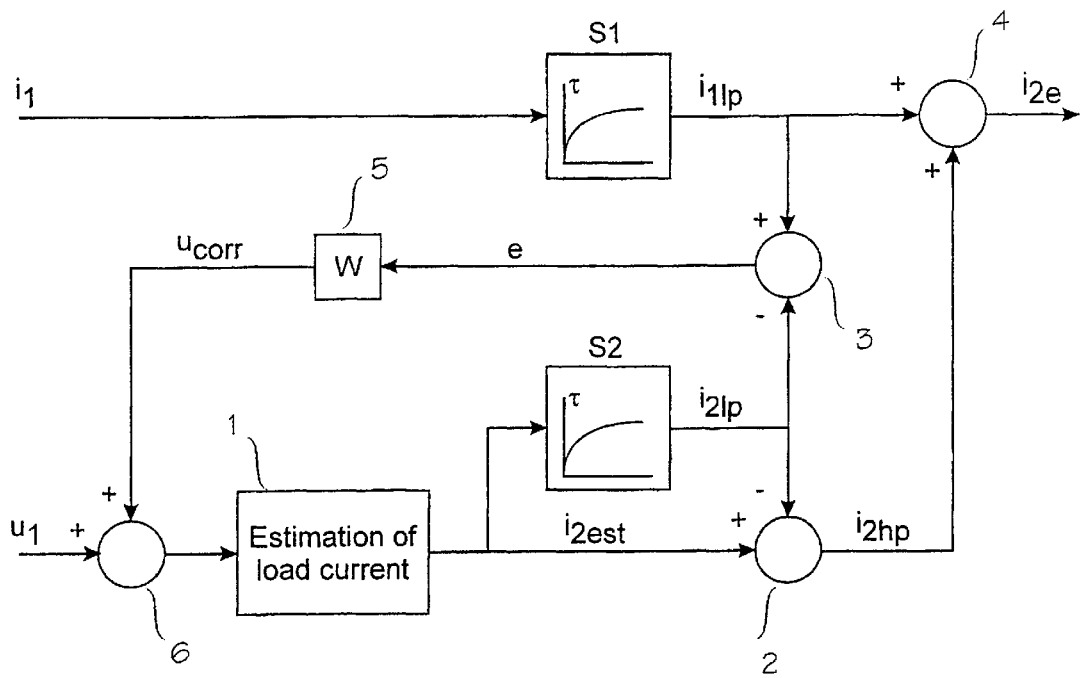
FIG. 4 is a block diagram illustrating an embodiment of the method of the invention.

Although the DC value of the load current estimate i2est is insignificant, since only the high-pass-filtered component is utilized, problems may occur in practice if the offset error of the load current estimate accumulates and the absolute value of the estimate is therefore very high, thereby causing overflow. In an embodiment of the invention, the load current estimate is corrected so that the offset error, if any, will not be too big. As shown in FIG. 4, a correction term ucorr is added to voltage u1, which is the basis of the load current estimate, the correction term being proportional to the difference of the low-pass-filtered currents. The low-pass-filtered currents can also be compared in some other way than by subtracting the currents, for example by using a comparator circuit.

The correction term ucorr is obtained in the embodiment by multiplying the difference of the currents by a weighting coefficient W. The outputs of the low-pass filters S1 and S2 are connected to the inputs of a summing means 3, whereby the output of the summing means 3 provides an error parameter e proportional to the difference of the filter outputs. The output of the summing means 3 is connected to a coefficient block 5, whose output is the correction term ucorr. In the embodiment, the correction term ucorr is added to voltage u1, so the output of the coefficient block 5 is connected to the input of a summing means 6. To one of the two inputs of the summing block 6 is connected measured voltage u1.

The feedback provided using the correction term is such that, for example, when the load current estimate is smaller than the measured current, the correction term is positive, which in turn forces the computational current to grow bigger and thereby approach the measured value. Also, even the absolute value of the load current estimate will be close to the actual load current.

Figure 5:
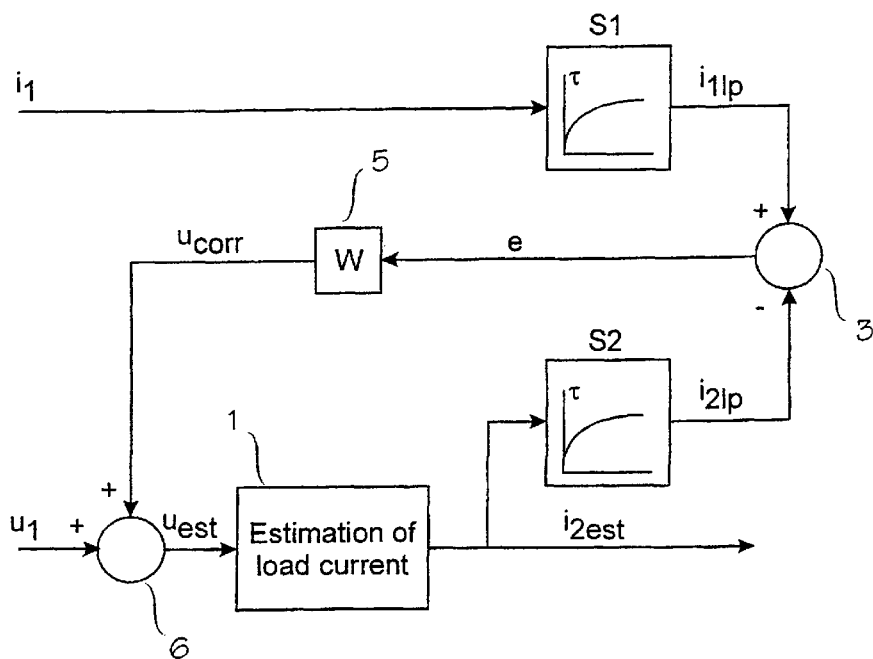
FIG. 5 is a block diagram illustrating a method of the invention.

When the above-kind of feedback is used in the invention, the load current used can be the load current estimate i2est. According to FIG. 5, the load current i2e need not be formed by summing two different components in the embodiment; due to the feedback the DC level of the load current estimate will be correct, whereby the load current estimate can be used as the load current. The block diagram of the invention shown in FIG. 5 differs from the block diagram of FIG. 4 described above in that summing means 2 and 4 have been removed and that instead of i2e, computationally estimated current i2est is used as the output signal of the system.

It will be obvious to those skilled in the art that the basic idea of the invention can be implemented in many different ways. The invention and its embodiments are thus not restricted to the above examples but can vary within the scope of the claims.

What is claimed is:

1. A method of defining an instantaneous value of a current (i2e) of a pulse-controlled inductive load when the impedance of the load is known, the method comprising the steps of measuring the output voltage (u1) of a pulsed voltage source, and measuring the output current (i1) of the pulsed voltage source, the method being characterized by further comprising the steps of low-pass filtering the measured output current (i1) of the pulsed voltage source to produce a fundamental wave current (i1lp), defining a load current estimate (i2est) by computation on the basis of the measured output voltage (u1) of the pulsed voltage source and the impedance of the load, high-pass filtering the load current estimate (i2est), and defining the instantaneous value of the load current (i2e) by adding the high-pass filtered load current estimate (i2hp) to the fundamental wave current (i1lp).

2. A method as claimed in claim 1, characterized by the high-pass filtering of the load current estimate (i2est) comprising the steps of low-pass filtering the load current estimate (i2est), and subtracting the low-pass-filtered component (i2lp) of the load current estimate from the load current estimate (i2est).

3. A method as claimed in claim 2, characterized by the method further comprising the steps of comparing the fundamental wave current (i1lp) with the low-pass-filtered load current estimate (i2lp) to produce an error parameter (e) proportional to the difference of the currents, multiplying the error parameter (e) by a coefficient (W) to produce a correction term (ucorr), and adding the correction term (ucorr) to the value of the voltage used as the basis of the load current estimate (i2est).

4. A method as claimed in claim 3, characterized by the comparison of the fundamental wave current (i1lp) with the low-pass-filtered load current estimate (i2lp) comprising a step in which said currents are subtracted from each other.

5. A method of defining an instantaneous value of a current (i2e) of a pulse-controlled inductive load when the impedance of the load is known, the method comprising the steps of measuring the output voltage (u1) of a pulsed voltage source, and measuring the output current (i1) of the pulsed voltage source, the method being characterized by further comprising the steps of adding a correction term (ucorr) to the output voltage (u1) of the pulsed voltage source to produce an estimation voltage (uest);

defining a load current estimate (i2est) by computation on the basis of the estimation voltage (uest) and the impedance of the load, whereby the load current estimate (i2est) provides the instantaneous value of the load current (i2e);

low-pass filtering the load current estimate (i2est);

low-pass filtering the measured output current (1) of the pulsed voltage source to produce a fundamental wave current (i1lp);

comparing the fundamental wave current (i1lp) with the low-pass-filtered load current estimate (i2lp) to produce an error parameter (e) proportional to the difference of the currents; and multiplying the error parameter (e) by a coefficient (W) to produce the correction term (ucorr).

6. A method as claimed in claim 5, characterized in that the comparison of the fundamental wave current (i1lp) with the low-pass-filtered load current (i2lp) comprises a step in which said currents are subtracted from each other.

* * * * *

UNITED STATES PATENT AND TRADEMARK OFFICE
CERTIFICATE OF CORRECTION

PATENT NO. : 6,195,274 B1 Page 1 of 1
DATED : February 27, 2001
INVENTOR(S) : Schroderus et al.

It is certified that error appears in the above-identified patent and that said Letters Patent is hereby corrected as shown below:

Title page,
Item [87]: PCT PUB. DATE: JULY 1, 1999

Signed and Sealed this

Twenty-first Day of August, 2001

Attest:

*Nicholas P. Godici*

NICHOLAS P. GODICI
*Attesting Officer*     *Acting Director of the United States Patent and Trademark Office*